(12) United States Patent
Ballon et al.

(10) Patent No.: US 6,262,443 B1
(45) Date of Patent: Jul. 17, 2001

(54) MONOLITHIC PROTECTED RECTIFYING BRIDGE

(75) Inventors: Christian Ballon, Tours; Eric Bernier, Mettray, both of (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

(21) Appl. No.: 08/914,103

(22) Filed: Aug. 19, 1997

(30) Foreign Application Priority Data

Aug. 27, 1996 (FR) .................................................. 96 10659

(51) Int. Cl.[7] .................................................. H01L 29/74
(52) U.S. Cl. .......................... 257/121; 257/109; 257/544
(58) Field of Search ................................... 257/394, 501, 257/505, 513, 109, 111, 112, 121, 146, 173, 611, 544

(56) References Cited

U.S. PATENT DOCUMENTS

| | | | |
|---|---|---|---|
| 4,228,448 | * 10/1980 | Lalumia et al. | 357/46 |
| 4,400,711 | * 8/1983 | Avery | 357/43 |
| 5,311,042 | * 5/1994 | Anceau | 257/173 |
| 5,471,074 | * 11/1995 | Pezzani | 257/121 |
| 5,473,170 | * 12/1995 | Bernier | 257/174 |
| 5,710,442 | * 1/1998 | Watanabe et al. | 257/107 |
| 5,808,326 | 9/1998 | Bernier et al. | 257/109 |

FOREIGN PATENT DOCUMENTS 0 721 218   7/1996   (EP) .............................. H01L/27/08

OTHER PUBLICATIONS

French Search Report from French Patent Application 96 10659, filed Aug. 27, 1996.

* cited by examiner

*Primary Examiner*—Olik Chaudhuri
*Assistant Examiner*—Douglas A. Wille
(74) *Attorney, Agent, or Firm*—Wolf, Greenfield & Sacks, P.C.; James H. Morris; Theodore E. Galanthay

(57) ABSTRACT

The present invention relates to a semiconducting structure constituting a protected rectifying bridge implemented in an N-type semiconductor substrate divided into first, second, and third wells by vertical P-type isolating walls, in which the rear surface of the substrate is coated with a first metallization and in which each of the first and second wells includes a vertical diode and a vertical Shockley diode. The third well includes a P-type isolating layer on its rear surface side in contact with the first metallization and, on its front surface side, two lateral diodes, each of which is formed between a P-type region and the substrate.

17 Claims, 4 Drawing Sheets

MONOLITHIC PROTECTED RECTIFYING BRIDGE

BACKGROUND OF THE INVENTION

1. Field of the Invention

The present invention relates to the implementation of a monolithic rectifying bridge protected against overvoltages.

2. Discussion of the Related Art

Power components currently available for sale are implemented based on technologies in which the rear surface of the component is uniformly coated with a metallization in contact with the apparent semiconducting layers of this rear surface. With these types of technologies, it has been considered, up to now, that it was not possible to implement in monolithic form a component providing the functions of a medium or high power rectifying bridge protected against overvoltages, and such components are not available for sale.

Besides, French patent application 94/16011 filed on Dec. 30, 1994, by the applicant, entitled "Integrated power circuit", and incorporated herein by reference discloses a new concept of an integrated power circuit which enables monolithic assembly of many logic and power components in the same semi-conductor circuit. In order to achieve this result, this patent application notably teaches to appropriately use insulating layers formed on the rear surface of a component, the rear surface metallization being partly in contact with the rear surface semiconductor structures and being partly insulated by these insulating layers.

The use of the teachings of this patent application is extremely rich and enables implementation, in monolithic form, of many component assemblies which were previously implemented only as assemblies of discrete components.

Among the examples of application given in this patent application, there appear rectifying bridges protected against overvoltages.

FIG. 11A of this prior patent application, reproduced in FIG. 1, shows such a protected rectifying bridge including four rectifying diodes D1 to D4 and a double Shockley S. Diagrams equivalent to the diagram of FIG. 11A of this patent application are illustrated in FIGS. 11B and 11C, this last drawing being reproduced in FIG. 2. It should be noted that from a functional point of view, the diagram of FIG. 2 is strictly identical to that of FIG. 1. In FIGS. 1 and 2, terminals T1, T2 designate a.c. supply terminals and terminals T+ and T− designate d.c. voltage supply terminals.

Next, this prior patent application shows in its FIGS. 13A and 13B, reproduced in FIGS. 3A and 3B, a simplified example of implementation of the circuit illustrated in FIG. 11C (appended FIG. 2). In FIGS. 3A and 3B, exactly the same reference numbers as in FIGS. 13A and 13B of the prior patent application are kept and, to describe these drawings, reference will be made to this prior patent application.

It will only be noted that:

N-type substrate 1 is lightly doped, regions 30 and 31 correspond to P-type isolating walls, diode D2 and Shockley diode S2 are formed vertically in a first well, diode D4 and Shockley diode S4 are formed vertically in a second well, diodes D1 and D3 are formed laterally in a third well.

Diode D1 corresponds to PNN$^+$ regions 52, 1, 54, diode D3 corresponds to PNN$^+$ regions 53, 1, 54, diode D2 corresponds to PNN$^+$ regions 42, 1, 50 and diode D4 to homologous regions, Shockley diode S2 includes from its anode to its cathode PNN+PN regions 40, 1, 46, 42 and 44 and Shockley diode S4 includes homologous regions.

The structure described and schematically shown in FIGS. 3A and 3B gives satisfactory results.

However, in the field of semiconductor component fabrication, manufacturers generally desire to derive as little as possible from conventional and tested dies. Thus, when it is possible to avoid using technologies requiring to use a rear surface insulated layer, this solution is preferred.

SUMMARY OF THE INVENTION

An object of the present invention thus is to provide a monolithic protected rectifying bridge structure wherein the rear surface metallization is, along its whole extent, in contact with a semiconducting structure.

Another object of the present invention is to provide such a structure wherein the properties of the various diodes are optimized by an appropriate selection of the doping steps used.

Another object of the present invention is to provide such a structure wherein the effects of possible parasitic transistors are made negligible.

To achieve these objects, as well as others, the present invention provides a semiconducting structure forming a protected rectifying bridge implemented in an N-type semiconductor substrate divided into first, second, and third wells by vertical P-type isolating walls, in which the rear surface of the substrate is coated with a first metallization and in which each of the first and second wells includes a vertical diode and a vertical Shockley diode, the first metallization corresponding to the anodes of the vertical diodes and to the cathodes of the Shockley diodes. The third well includes a P-type isolating layer on its rear surface side in contact with the first metallization and, on its front surface side, two lateral diodes, each of which is formed between a P-type region and the substrate.

According to an embodiment of the present invention, the anode layers of the rear surface side of the vertical diodes of the first and second wells are comprised of a deep diffused layer corresponding to an isolating wall diffusion.

According to an embodiment of the present invention, the anodes of each of the Shockley diodes are comprised of a central portion formed by a diffusion of the same type as that of the forming of an isolating wall and of a lateral portion formed by a P-type diffusion which is shallower and more doped in surface.

According to an embodiment of the present invention, each of the isolating walls is coated with an overdoped region of the same type of conductivity, the overdoped region being coated on most of its surface with a metallization.

According to an embodiment of the present invention, the anode layers of the lateral diodes and the P-type isolating layer are shallow and highly-doped layers.

These objects, characteristics and advantages as well as others, of the present invention, will be discussed in detail in the following non-limiting description of specific embodiments of the present invention, in relation with the accompanying drawings.

DETAILED DESCRIPTION

As is conventional in the field of the representation of semiconductor components, the several cross-sectional views are not drawn to scale and are very much simplified to simplify the readability and the outline of the drawings.

Figure 1:
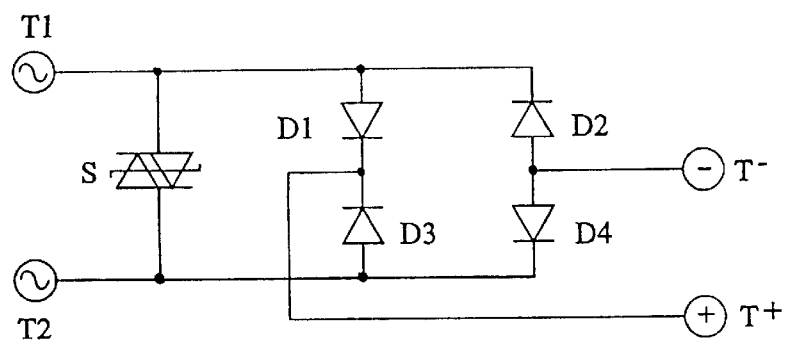
FIGS. 1 and 2 show diagrams of rectifying bridges protected against overvoltages.
Figure 2:
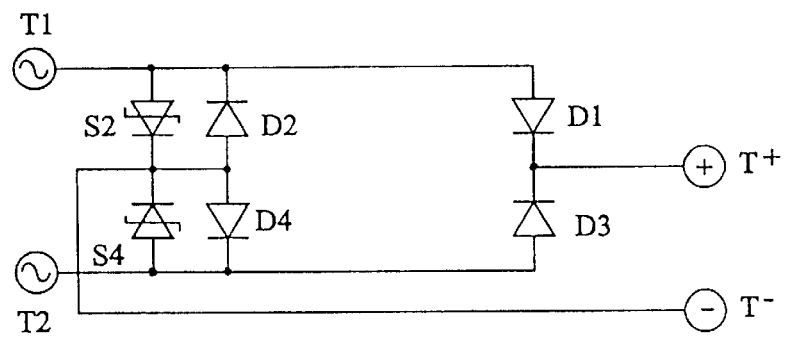
Figure 4:
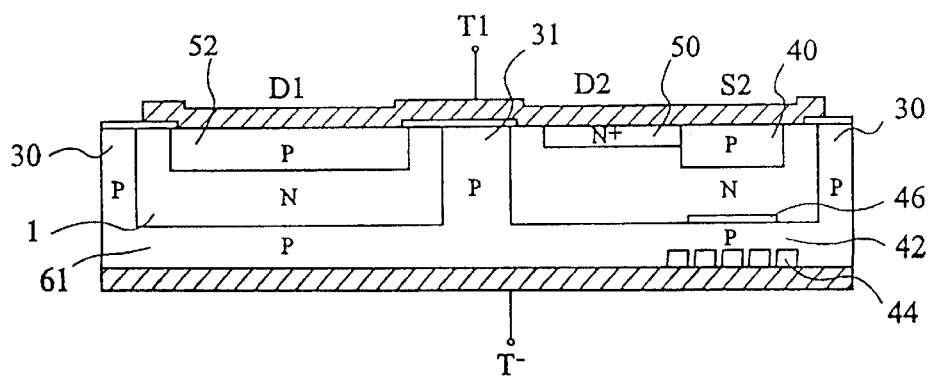
FIG. 4 shows a simplified cross-sectional view of a monolithic protected rectifying bridge structure according to the present invention.
Figure 3A:
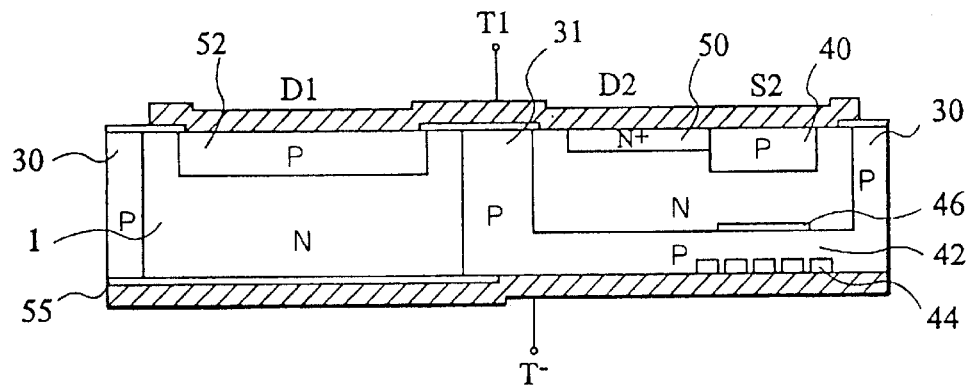
FIGS. 3A and 3B show a simplified cross-sectional view and top plan view of a monolithic protected rectifying bridge structure according to prior art.

FIG. 4 very schematically shows a cross-sectional view of a structure according to the present invention, shown in a manner analogous to that of FIG. 3A. In these two drawings, as well as in the following drawings, the same reference numbers refer to the same components.

According to the present invention, the well containing diodes D1 and D3 is modified. Rear surface insulating layer 55 (shown in FIG. 3A) is eliminated and a P-type layer 61 is formed on the rear surface side.

It appears in this structure that the junction between substrate 1 and layer 61 is always satisfactorily biased to avoid the starting of parasitic diodes, transistors or thyristors.

It should be noted that the transition from a dielectric isolation as in the case of FIG. 3A to a junction isolation as in the case of FIG. 4 was far from being obvious for those skilled in the art. Indeed, among all the examples of structures described in the above-mentioned patent application, only the structure of FIG. 3 can be modified to reach this solution satisfactorily. It should also be reminded that, before the implementation of the structure described in FIG. 3 and of the other structures described in the prior patent application, it was not known to monolithically implement a protected rectifying bridge using conventional isolation techniques by junction and contact between a rear surface of a semiconducting wafer and a metallization.

Figure 5A:
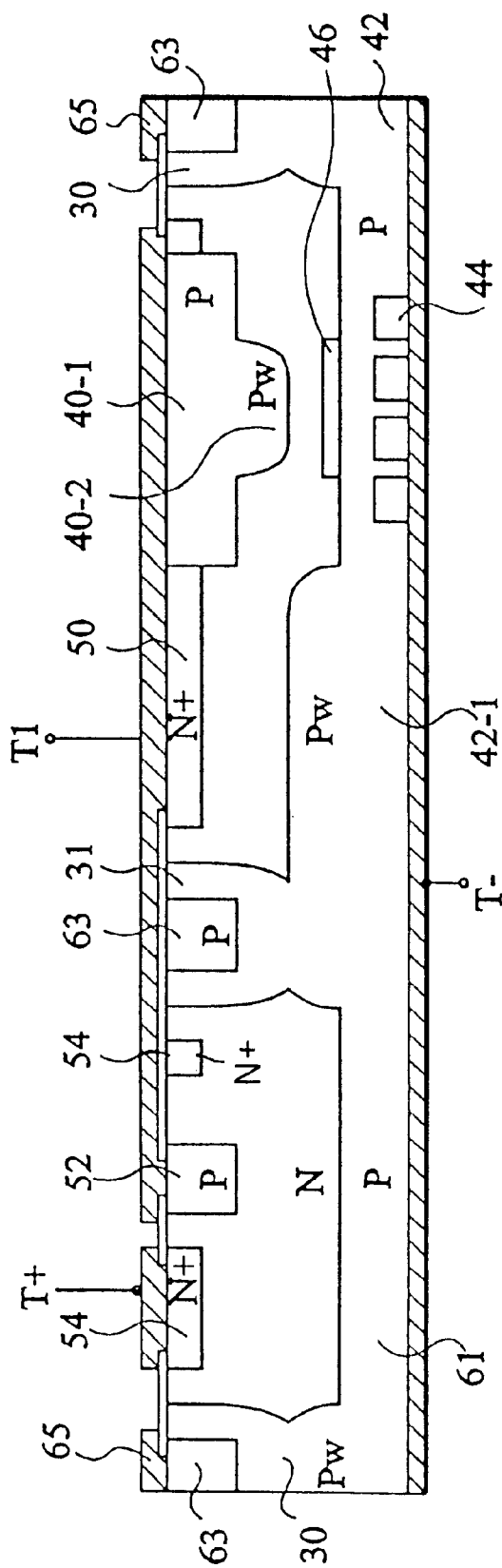
FIGS. 5A and 5B show a simplified cross-sectional view and top plan view of a protected rectifying bridge structure according to the present invention.
Figure 5B:
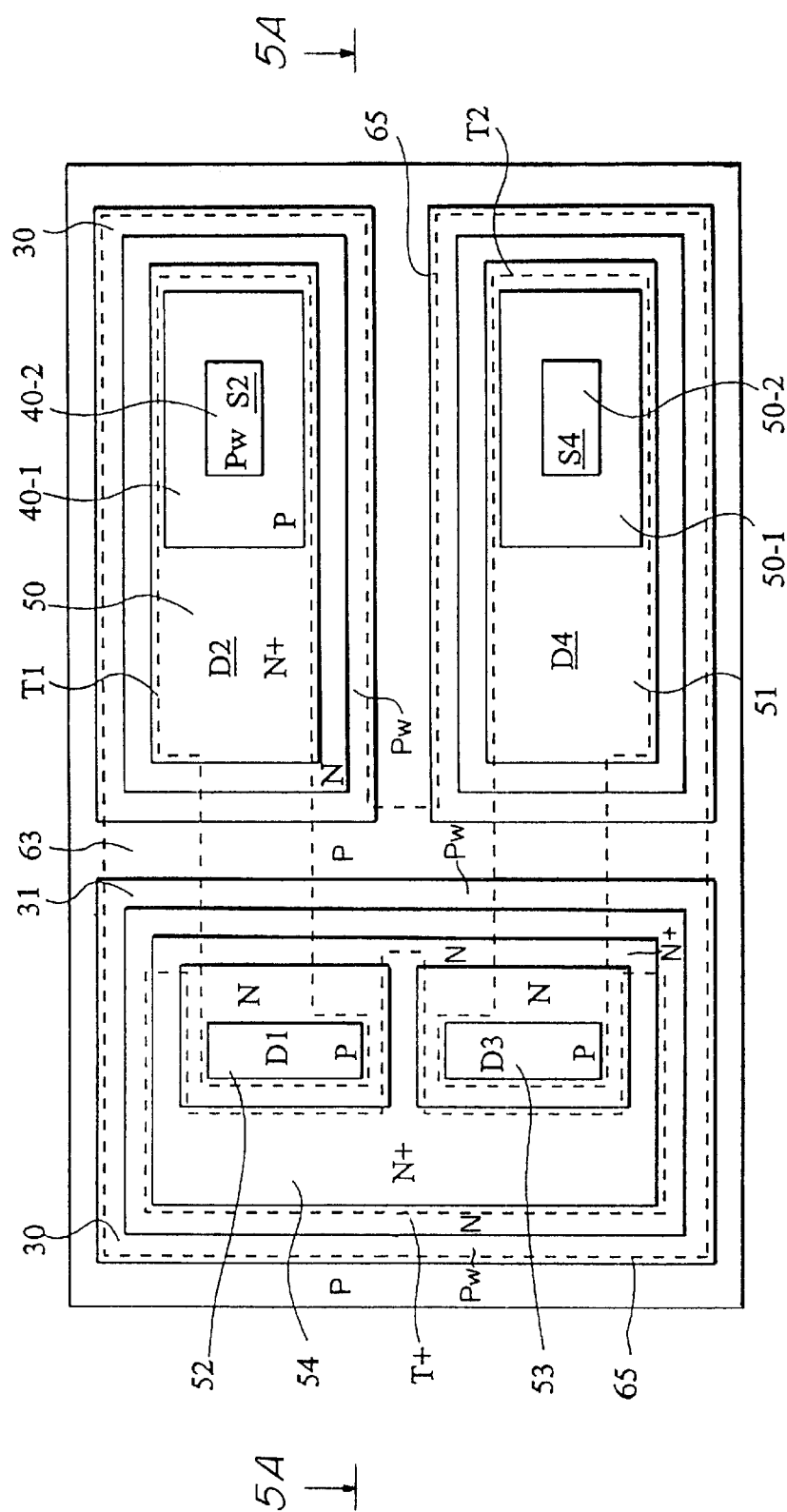

FIGS. 5A and 5B illustrate in cross-sectional view and in elevational view an example of implementation of a structure according to the present invention. This implementation is performed according to a technology according to which the following main diffusion steps are used, in an N-type substrate with a doping level from 1 to $6.10^{14}$ atoms/cm$^3$:

- a first P-type or $P_{well}$ drive-in which extends at the end of the process down to a depth higher than half the thickness of the substrate and having for example a surface concentration Cs=$5.10^{17}$ atoms/cm$^3$. This drive-in is notably used to form isolating walls dividing the semiconducting structure into several wells. In FIG. 5A, this type of diffusion is designated in some locations by reference $P_W$,
- a second shallower and more surface-doped P-type diffusion having for example a drive-in depth xj=20 μm and a surface concentration Cs=$10^{18}$ atoms/cm$^3$. In the drawing, some of the regions corresponding to this second diffusion are merely designated by letter P,
- an N-type highly doped diffusion, designated in the drawing by reference N$^+$, and
- possibly an N-type drive-in for setting the starting threshold of the Shockley diodes.

In FIGS. 5A and 5B, diode D2 and Shockley diode S2 are formed in a first well, diode D4 and Shockley diode S4 are formed in a second well and diodes D1, D3 are formed in a third well.

The general outlook of the diodes in the first and second wells corresponds to that schematically illustrated in FIGS. 3 and 4. It should however be noted that the portion of P-type layer 42 on the rear surface side of diodes D2 and D4, designated by reference 42-1, corresponds to a drive-in of the type previously designated as $P_{well}$. Anode 40 of Shockley diode S2 (and the corresponding anode of Shockley diode S4) is formed of a central portion 40-2 corresponding to first diffusion $P_W$ and of a more extended surface portion 40-1 corresponding to the second P-type diffusion.

As concerns the third well in which are formed diodes D1 and D3, the rear surface is, as indicated previously, provided with a P-type region 61. This region is of the second P diffusion type and not of $P_{well}$ type.

Figure 3B:
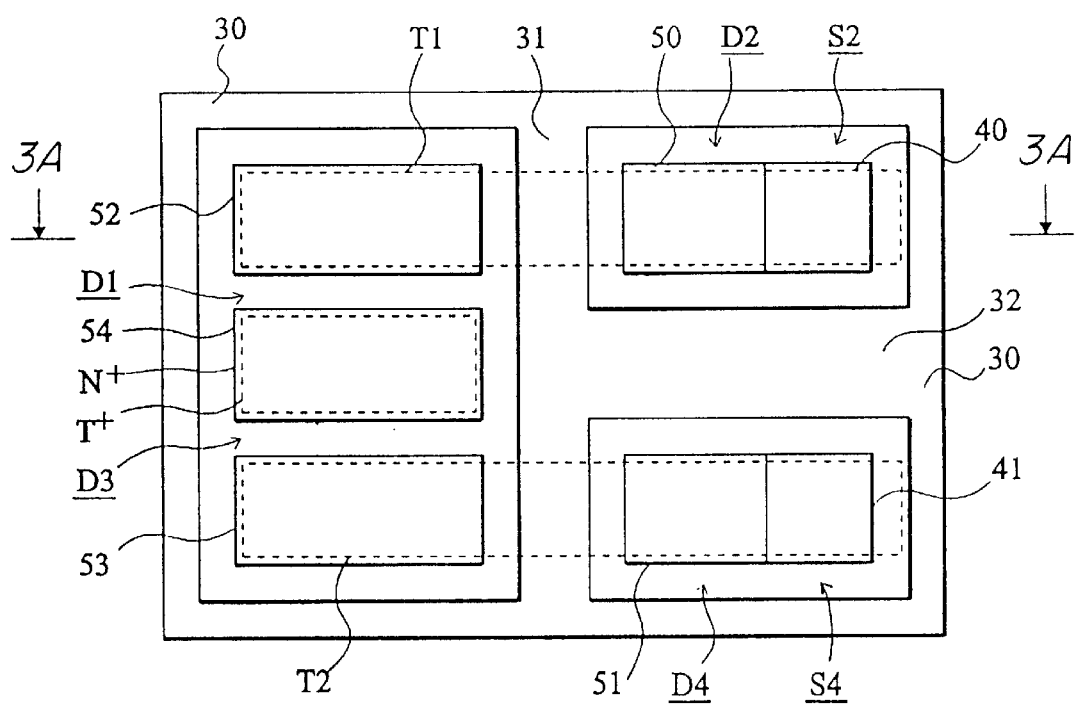

As shown in the elevational view of FIG. 5B, the disposition of the layers on the upper surface side of the substrate in the third well is different from that in FIG. 3B. More specifically, N-type region 54 constituting the common cathode of diodes D1 and D3 surrounds P-type regions 52 and 53 constituting the cathodes of these diodes D1 and D3.

Reference will be made to FIG. 5B for the general topology of the various regions.

The described embodiment has many optimizations to avoid the influence of parasitic transistors. Especially:

vertical PNP parasitic transistors, the emitters of which correspond to anodes 52, 53, of diodes D1 and D3, and the collectors of which correspond to region 61 have a reduced gain due to the fact that their base corresponds to the very thick substrate and that their emitters and collectors correspond to shallow P diffusions (and not to $P_{well}$ diffusions), the lateral parasitic PNP transistor, the emitter and the collector of which respectively correspond to anode 52, 53, of each of diodes D1, D3, has a reduced gain due to a proper distance between these anodes, and the lateral parasitic NPN transistor, the emitter and the collector of which respectively correspond to cathode 50, 51, of each of diodes D2, D4, has a reduced gain due to a proper distance between these cathodes, and due to the fact that its base corresponds to a relatively highly-doped $P_{well}$ region 42-1.

It should however be noted that within each of the $P_{well}$ regions forming an isolating wall, a P-type region 63 is formed on the upper surface side. Most of region 63 is coated with a metallization 65 which extends outside the dotted lines of same reference of FIG. 5B. Preferably, at least between the several wells, this region 63 is doubled (not shown) to improve the voltage that can be withstood by the oxide coating regions 30-31-63. Indeed, the voltage that can be withstood by the oxide is better above $P_W$ diffusions than above regions disturbed by the double $P_W$ and P diffusion.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconducting structure comprising:
  a semiconducting structure forming a protected rectifying bridge implemented in an N-type semiconductor substrate divided into first, second, and third wells by vertical P-type isolating walls, in which a rear surface of the substrate is coated with a first metallization and in which each of the first and second wells includes a vertical diode and a vertical Shockley diode, the first metallization in contact with anodes of the vertical diodes and cathodes of the Shockley diodes, wherein the third well includes a P-type isolating layer on its rear surface side in contact with the first metallization and, on its front surface side, two lateral diodes, each of which is formed between a P-type region and the substrate, each of the two lateral diodes having a cathode and an anode in contact with metallizations.

2. A semiconducting structure according to claim 1, wherein the anodes of each of the vertical diodes of the first and second wells are comprised of a deep diffusion layer of the same type as an insulating wall diffusion.

3. A semiconducting structure according to claim 1, wherein the anodes of each of the Shockley diodes are comprised of a central portion formed by a diffusion of the same type as that of the forming of an isolating wall and of a lateral portion formed by a P-type diffusion which is shallower and more doped in surface than the central portion.

4. A semiconducting structure according to claim 1, wherein each of the isolating walls is coated, with an overdoped region of the same type of conductivity, the overdoped region coated on most of its surface with a metallization.

5. A semiconducting structure according to claim 1, wherein the anodes of each of the lateral diodes and the P-type isolating layer are shallow and highly-doped layers.

6. A semiconducting rectifying structure, comprising:

a semiconductor substrate of a first conductivity type isolating walls of a second conductivity type and separating said substrate into multiple wells;

a first metallization disposed on a rear surface of the substrate;

one of said wells including an isolating layer of a second conductivity type having a rear surface side in contact with said first metallization;

and a region of second conductivity type in said one well and forming with said substrate a lateral diode having a cathode in contact with a second metallization.

7. A semiconducting rectifying structure according to claim 6 wherein said first conductivity type is N-type.

8. A semiconducting rectifying structure according to claim 7 wherein said second conductivity type is P-type.

9. A semiconducting rectifying structure according to claim 8 including a plurality of vertical P-type isolating walls.

10. A semiconducting rectifying structure according to claim 6 wherein said multiple wells comprise first, second and third wells.

11. A semiconducting rectifying structure according to claim 10 wherein each of the first and second wells includes a vertical diode and a vertical Shockley diode.

12. A semiconducting rectifying structure according to claim 11 wherein the first metallization is in contact with anodes of the vertical diodes and cathodes of the Shockley diodes.

13. A semiconducting rectifying structure according to claim 12 wherein the third well includes a P-type isolating layer on its rear surface side in contact with the first metallization and, on its front surface side, two lateral diodes, each of which is formed between a P-type region and the substrate.

14. A semiconducting rectifying structure according to claim 13 wherein the anodes of the vertical diodes of the first and second wells are comprised of a deep diffused layer of the same type as an insulating wall diffusion.

15. A semiconducting rectifying structure according to claim 14, where the anodes of each of the Shockley diodes are comprised of a central portion formed by a diffusion of the same type as that of the forming of an isolating wall and of a lateral portion formed by a P-type diffusion which is shallower and more doped in surface than the central portion.

16. A semiconducting structure according to claim 13, wherein each of the isolating walls is coated, with an over-doped region of the same type of conductivity, the over-doped region coated on most of its surface with a metallization.

17. A semiconducting structure according to claim 13, wherein the anodes of each of the lateral diodes and the P-type isolating layer are shallow and highly-doped layers.

* * * * *